US011991831B2

(12) United States Patent
Katou et al.

(10) Patent No.: US 11,991,831 B2
(45) Date of Patent: May 21, 2024

(54) COMPONENT MOUNTING DEVICE AND MANUFACTURING METHOD FOR MOUNTING SUBSTRATE

(71) Applicant: Panasonic Intellectual Property Management Co., Ltd., Osaka (JP)

(72) Inventors: Hideaki Katou, Fukuoka (JP); Naoki Azuma, Fukuoka (JP); Koji Sakurai, Fukuoka (JP); Masanori Ikeda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/755,223

(22) PCT Filed: Aug. 4, 2020

(86) PCT No.: PCT/JP2020/029755

§ 371 (c)(1),
(2) Date: Apr. 24, 2022

(87) PCT Pub. No.: WO2021/084831

PCT Pub. Date: May 6, 2021

(65) Prior Publication Data

US 2022/0386517 A1 Dec. 1, 2022

(30) Foreign Application Priority Data

Oct. 29, 2019 (JP) ................................ 2019-196074

(51) Int. Cl.
*H05K 13/04* (2006.01)
*H05K 13/00* (2006.01)

(52) U.S. Cl.
CPC ......... *H05K 13/0015* (2013.01); *H05K 13/04* (2013.01)

(58) Field of Classification Search
CPC . H05K 13/0015; H05K 13/04; H05K 13/0813
See application file for complete search history.

(56) References Cited

U.S. PATENT DOCUMENTS 6,681,468 B1 * 1/2004 Uchiyama .......... H05K 13/0478 29/407.01
7,065,864 B2 * 6/2006 Yamamoto ......... H05K 13/0813 29/721

(Continued)

FOREIGN PATENT DOCUMENTS

DE 112016007500 T5 10/2019
JP 2015-119134 6/2015

(Continued)

OTHER PUBLICATIONS

International Search Report of PCT application No. PCT/JP2020/029755 dated Sep. 15, 2020.

(Continued)

*Primary Examiner* — Paul D Kim
(74) *Attorney, Agent, or Firm* — PEARNE & GORDON LLP

(57) ABSTRACT

A component mounting device is configured to mount, on a substrate, an electronic component having a functional unit. The component mounting device includes a component supply mechanism, a recognition unit, a component mounting mechanism, and a holding position determination unit. The component supply mechanism supplies the electronic component. The recognition unit recognizes a position of the functional unit. The component mounting mechanism holds the electronic component supplied from the component supply mechanism and mounts the electronic component on the substrate. The holding position determination unit determines a holding position of the electronic component by the (Continued)

component mounting mechanism based on the position of the functional unit recognized by the recognition unit.

14 Claims, 8 Drawing Sheets

(56) References Cited

U.S. PATENT DOCUMENTS

| | | | | |
|---|---|---|---|---|
| 2015/0176779 | A1 | 6/2015 | Azuma et al. | |
| 2016/0138787 | A1 | 5/2016 | Haji et al. | |
| 2016/0255752 | A1 | 9/2016 | Inoue et al. | |
| 2016/0255753 | A1 | 9/2016 | Inoue et al. | |
| 2019/0200460 | A1 | 6/2019 | Inoue et al. | |
| 2020/0077551 | A1 | 3/2020 | Okamoto | |
| 2020/0163264 | A1* | 5/2020 | Komaike | H05K 13/0813 |
| 2021/0112667 | A1 | 4/2021 | Inoue et al. | |

FOREIGN PATENT DOCUMENTS

| | | |
|---|---|---|
| JP | 2016-100379 A | 5/2016 |
| JP | 2016-157898 | 9/2016 |
| JP | 2016-157899 | 9/2016 |
| JP | 2017-139388 | 8/2017 |

OTHER PUBLICATIONS

The EPC Office Action dated Nov. 4, 2022 for the related European Patent Application No. 20882129.8.

* cited by examiner

COMPONENT MOUNTING DEVICE AND MANUFACTURING METHOD FOR MOUNTING SUBSTRATE

TECHNICAL FIELD

The present disclosure relates to a component mounting device that is configured to mount, on a substrate, an electronic component having a functional unit, and a manufacturing method for a mounting substrate.

BACKGROUND ART

In recent years, an illumination substrate having a light emitting element such as a chip light emitting diode (LED) for surface mounting and a substrate on which the light emitting element is mounted has been widely used. The illumination substrate is manufactured by a method in which the light emitting element is mounted on the substrate by a component mounting device and bonded to the substrate by solder bonding. At the time of mounting the light emitting element on the substrate, a tape feeder supplies the light emitting element stored in a carrier tape, and a suction nozzle holds the upper surface of the light emitting element by vacuum suction and transfers and mounts the light emitting element on the substrate (for example, PTL 1).

CITATION LIST

Patent Literature

PTL 1: Unexamined Japanese Patent Publication No. 2015-119134

SUMMARY OF THE INVENTION

A component mounting device of the present disclosure is configured to mount, on a substrate, an electronic component having a functional unit. The component mounting device includes a component supply mechanism, a recognition unit, a component mounting mechanism, and a holding position determination unit. The component supply mechanism supplies the electronic component. The recognition unit recognizes a position of the functional unit. The component mounting mechanism holds the electronic component supplied from the component supply mechanism and mounts the electronic component on the substrate. The holding position determination unit determines a holding position of the electronic component, based on the position of the functional unit recognized by the recognition unit, the holding position being a position on the electronic component and being held by the component mounting mechanism.

In the manufacturing method for the mounting substrate of the present disclosure, the mounting substrate is manufactured using the component mounting device that holds the electronic component having the functional unit and mounts the electronic component on the substrate by the component mounting mechanism. In the manufacturing method, the position of the functional unit is recognized, and based on the position of the functional unit, the holding position of the electronic component by the component mounting mechanism is determined. Thereafter, the electronic component is held by the component mounting mechanism at the determined holding position and is mounted on the substrate.

According to the present disclosure, the electronic component having the functional unit can be sucked at an appropriate position and can be mounted on the substrate.

DESCRIPTION OF EMBODIMENT

Figure 1:
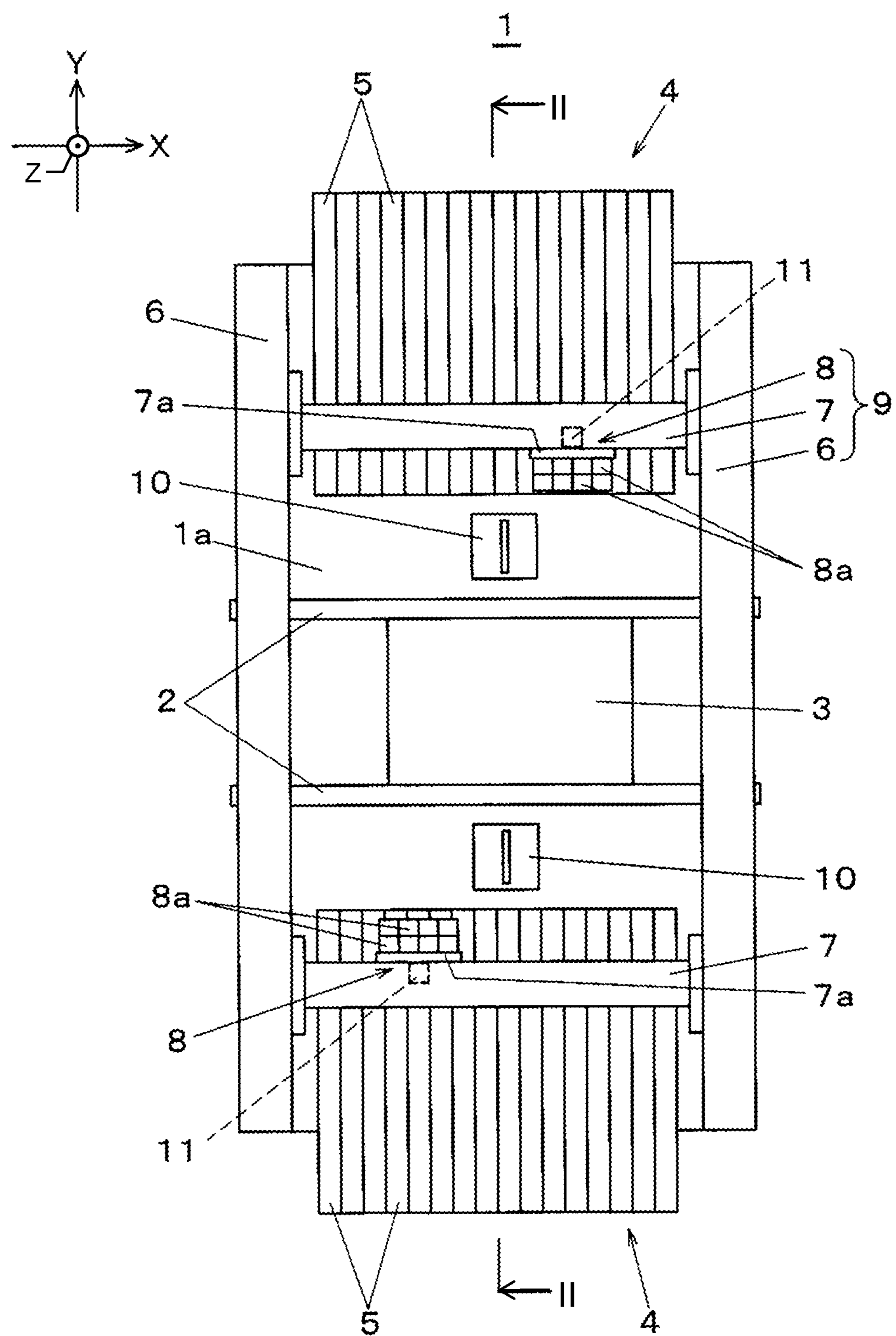
FIG. 1 is a top view of a component mounting device according to an exemplary embodiment of the present disclosure.

Prior to description of an exemplary embodiment of the present disclosure, the background leading to the idea of the present disclosure is briefly described. In the conventional technique including PTL 1, the position where the suction nozzle holds the electronic component is set at the center of the outer shape of the electronic component or the center of the pocket in which the electronic component is stored in the carrier tape. However, a light emitter as the functional unit is provided on the upper surface of the light emitting element. Therefore, when the light emitting element is held by the suction nozzle, the following problems occur. In the case where the light emitter is formed of a soft material, when the suction nozzle sucks the light emitter, the characteristics of the light emitting element are possibly deteriorated. On the other hand, in the case where a portion other than the light emitter is formed of a soft material, when the portion other than the light emitter is sucked, there is a possibility of the light emitting element adhering to the suction nozzle and not being able to be detached therefrom. Therefore, the light emitting element needs to be sucked at an appropriate position according to the structure of the light emitting element.

The present disclosure provides a component mounting device and a manufacturing method for a mounting substrate which enable an electronic component having a functional unit to be sucked at an appropriate position and to be mounted on a substrate.

An exemplary embodiment of the present disclosure is described below in detail with reference to the drawings. The configuration, shape, and the like described below are examples for description, and can be appropriately changed according to the specification of a component mounting device. Hereinafter, elements corresponding to each other throughout all the drawings are denoted by the same reference marks, and duplicative description is omitted. In the drawing, two axes orthogonal to each other in the horizontal plane are indicated by an X axis (left-and-right direction in FIG. 1) along a substrate conveyance direction and a Y axis (up-and-down direction in FIG. 1) orthogonal to the substrate conveyance direction. In addition, a Z-axis (up-and-down direction in FIG. 2) along the vertical direction orthogonal to the horizontal plane is illustrated.

First, a configuration of component mounting device 1 is described with reference to FIGS. 1 and 2. Note that FIG. 2 partially illustrates a cross section taken along line II-II in FIG. 1. Component mounting device 1 performs a component mounting operation of mounting, on substrate 3, an electronic component supplied from component supply unit 4. As illustrated in FIG. 2, in the center of base 1*a*, substrate conveyance mechanism 2 is installed along the X axis. Substrate conveyance mechanism 2 takes substrate 3 conveyed from the upstream in a mounting operation position to position and hold substrate 3. In addition, substrate conveyance mechanism 2 takes substrate 3 completed with the component mounting operation out to the downstream.

Figure 2:
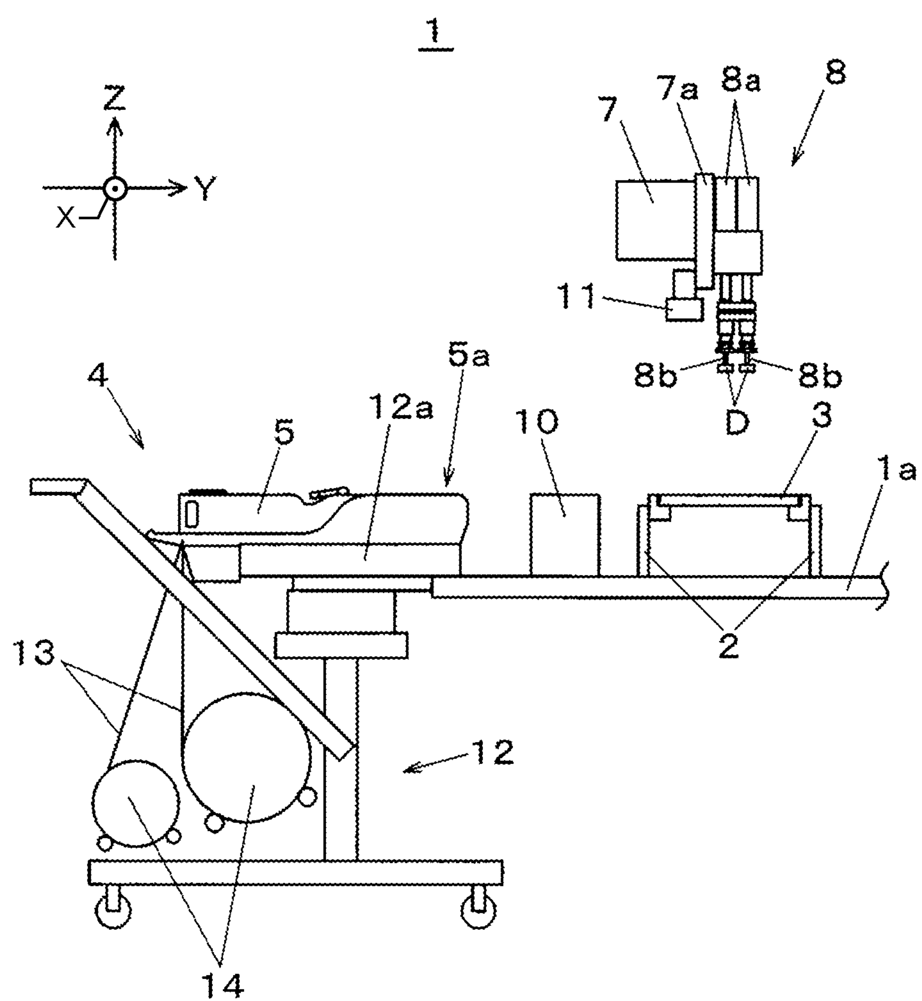
FIG. 2 is a partial transparent side view of the component mounting device illustrated in FIG. 1.

As illustrated in FIG. 1, component supply units 4 are disposed on both sides of substrate conveyance mechanism 2. A plurality of tape feeders 5 are attached in parallel to each of component supply units 4. Tape feeder 5 pitch feeds a carrier tape formed with a pocket storing an electronic component in a direction from the outside of component supply unit 4 toward substrate conveyance mechanism 2 (tape feeding direction). By this pitch feeding, tape feeder 5 supplies the electronic component to component supply position 5*a* at which mounting head 8 illustrated in FIG. 2 picks up the electronic component. That is, tape feeder 5 functions as a component supply mechanism that supplies the electronic component.

As illustrated in FIG. 1, Y-axis beams 6 having a linear drive mechanism are disposed on the upper surface at both X-axis ends of base 1*a* so as to extend along the Y axis. Similarly, two X-axis beams 7 each having a linear drive mechanism are coupled to two Y-axis beams 6 so as to be movable along the Y axis. X-axis beams 7 are disposed so as to extend along the X axis. Mounting head 8 is attached to each of X-axis beams 7 so as to be movable along the X axis. Mounting head 8 includes a plurality of suction units 8*a* that can suck and hold the electronic component and can be lifted and lowered. As illustrated in FIG. 2, each of suction units 8*a* is attached with, at the lower end, suction nozzle 8*b* that sucks and holds the electronic component.

In FIG. 1, Y-axis beams 6 and X-axis beams 7 are driven to move mounting heads 8 along the X axis and the Y axis. By this movement, each of two mounting heads 8 sucks and takes out the electronic component by suction nozzle 8*b* from component supply position 5*a* of tape feeder 5 disposed in corresponding component supply unit 4, and mounts the electronic component on a mounting point on substrate 3 positioned by substrate conveyance mechanism 2. That is, Y-axis beam 6, X-axis beam 7, and mounting head 8 constitute component mounting mechanism 9 that holds the electronic component supplied from component supply position 5*a* of tape feeder 5 (component supply mechanism) by suction nozzle 8*b* and mounts the electronic component on substrate 3.

Between component supply unit 4 and substrate conveyance mechanism 2, component recognition camera 10 (hereinafter, referred to as first recognition camera) is disposed. When mounting head 8 that has taken out the electronic component from component supply unit 4 moves above first recognition camera 10, first recognition camera 10 photographs the electronic component held by mounting head 8 and recognizes the holding orientation of the electronic component. Plate 7*a* attached with mounting head 8 has substrate recognition camera 11 (hereinafter, referred to as second recognition camera) attached thereto. Second recognition camera 11 moves integrally with mounting head 8. That is, second recognition camera 11 moves together with mounting head 8 constituting component mounting mechanism 9.

By the movement of mounting head 8, second recognition camera 11 moves above substrate 3 positioned by substrate conveyance mechanism 2, and photographs a substrate mark (not illustrated) provided on substrate 3 to recognize the position of substrate 3. Further, second recognition camera 11 moves above component supply position 5*a* of tape feeder 5, and recognizes a state of the carrier tape in the vicinity of component supply position 5*a*. In the component mounting operation to substrate 3 by mounting head 8, the mounting position is corrected using the recognition result of the electronic component by first recognition camera 10, together with the recognition result of the electronic component and the recognition result of the position of substrate 3 by second recognition camera 11.

As illustrated in FIG. 2, carriage 12 is set to component supply unit 4, carriage 12 having a plurality of tape feeders 5 mounted in advance on feeder base 12*a*. Tape reel 14 is held on carriage 12. Tape reel 14 stores, in a wound state, carrier tape 13 holding the electronic components. Carrier tape 13 drawn from tape reel 14 is pitch fed by tape feeder 5 to component supply position 5*a*.

Figure 3A:
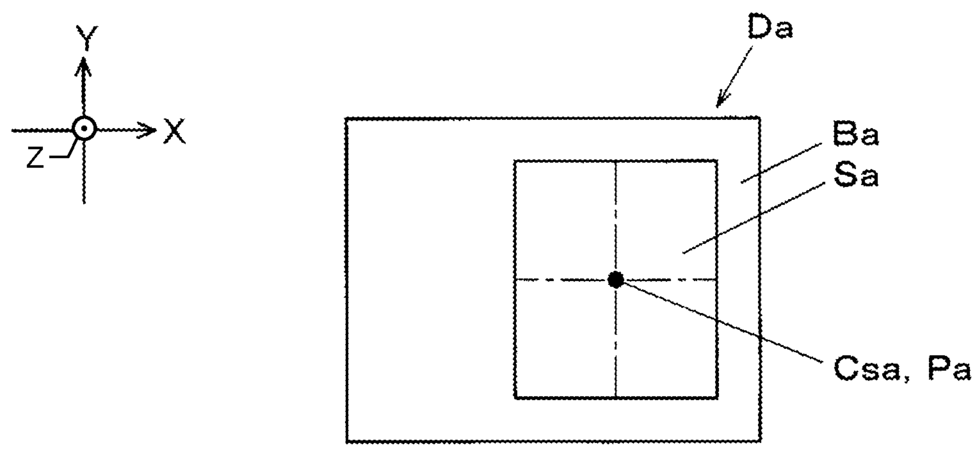
FIG. 3A is a top view of a light emitting element mounted on a substrate by the component mounting device according to the exemplary embodiment of the present disclosure.
Figure 3B:
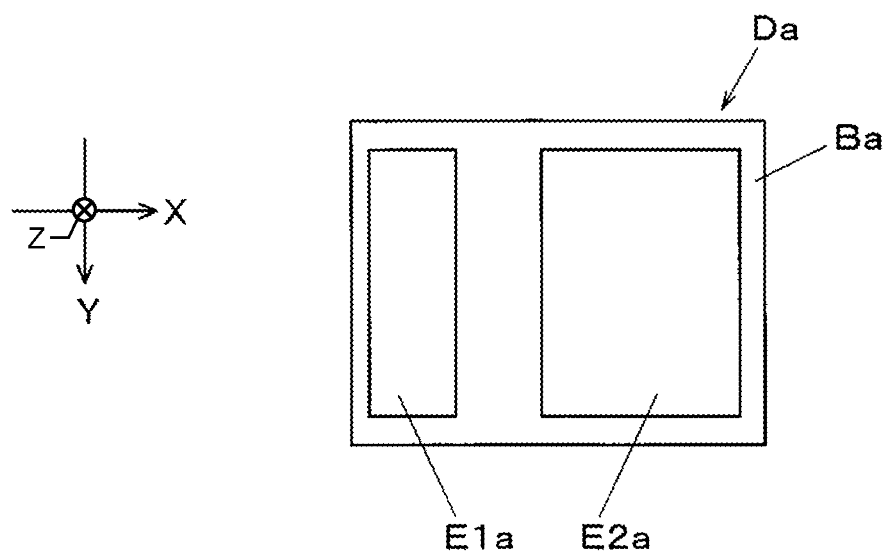
FIG. 3B is a bottom view of the light emitting element illustrated in FIG. 3A.
Figure 3C:
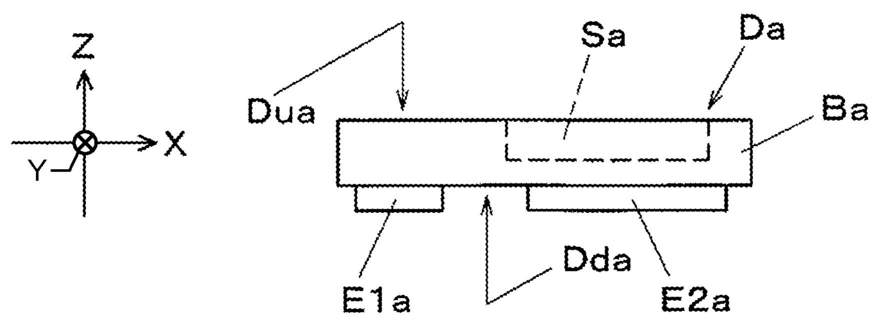
FIG. 3C is a side view of the light emitting element illustrated in FIG. 3A.

Next, a structure of light emitting element Da, which is an electronic component mounted on substrate 3, is described with reference to FIGS. 3A to 3C. Light emitting element Da is, for example, a chip LED for surface mounting. As illustrated in FIGS. 3A and 3C, light emitter Sa is provided on a part of upper surface Dua of main body Ba of light emitting element Da. As illustrated in FIGS. 3B and 3C, electrode E1*a* and electrode E2*a* are provided on back surface Dda of main body Ba. Light emitter Sa is a functional unit that emits light when a voltage is applied between electrode E1*a* and electrode E2*a*.

An upper part of light emitter Sa is formed of a hard material such as a lens. On the other hand, upper surface Dua of main body Ba other than light emitter Sa is formed of a material such as a soft resin. When light emitting element Da is held by suction nozzle 8*b* illustrated in FIG. 2, the upper part of hard light emitter Sa is set as holding position Pa to be sucked by suction nozzle 8*b*. In this example, light emission center Csa of light emitter Sa is selected as holding position Pa. Light emission center Csa indicates an example of a position of light emitter Sa which is the functional unit.

Figure 4A:
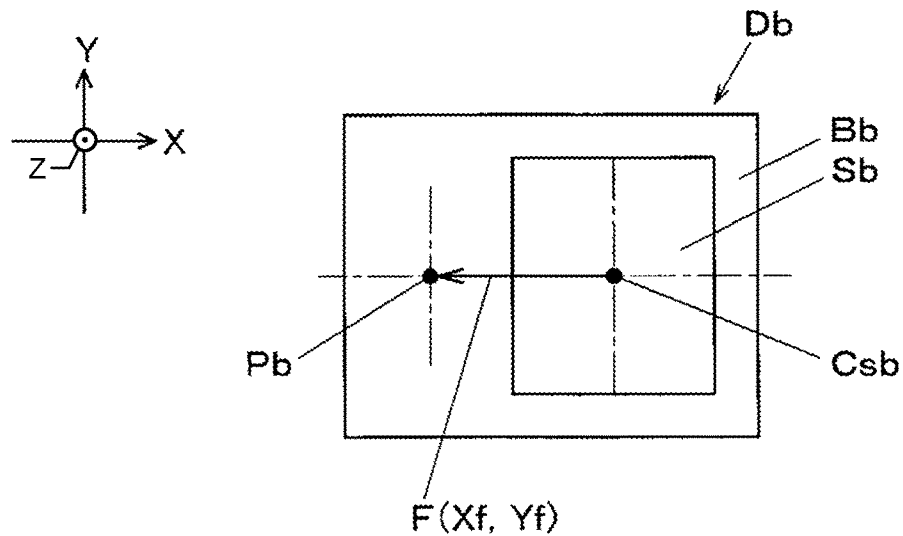
FIG. 4A is a top view of another light emitting element mounted on the substrate by the component mounting device according to the exemplary embodiment of the present disclosure.
Figure 4B:
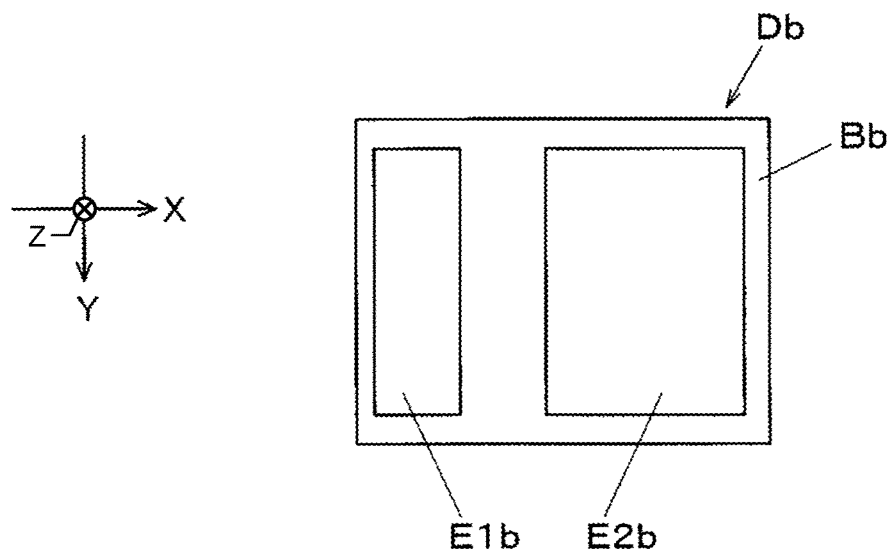
FIG. 4B is a bottom view of the light emitting element illustrated in FIG. 4A.
Figure 4C:
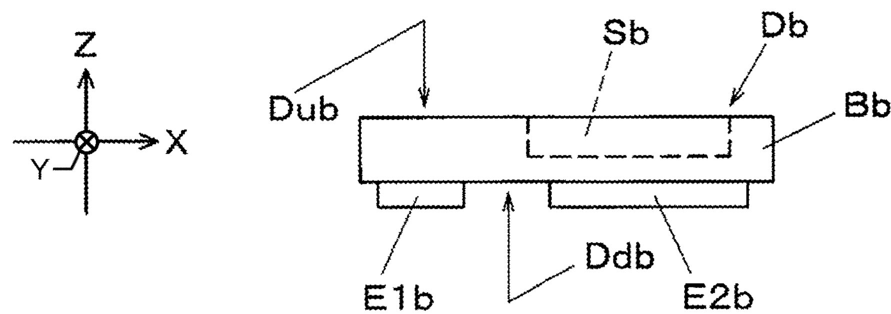
FIG. 4C is a side view of the light emitting element illustrated in FIG. 4A.

Next, a structure of light emitting element Db having a structure different from light emitting element Da illustrated in FIGS. 3A to 3C is described with reference to FIGS. 4A to 4C. As illustrated in FIGS. 4A and 4C, light emitter Sb is provided on a part of upper surface Dub of main body Bb of light emitting element Db to expose its upper part. As illustrated in FIGS. 4B and 4C, electrode E1*b* and electrode E2*b* are provided on back surface Ddb of main body Bb. Light emitter Sb is a functional unit that emits light when a voltage is applied between electrode E1*b* and electrode E2*b*.

In contrast to light emitting element Da, in light emitting element Db, light emitter Sb is formed of a material such as a soft resin, and upper surface Dub of main body Bb other than light emitter Sb is formed of a material such as a hard resin. When light emitting element Db is held by suction nozzle 8*b*, upper surface Dub of main body Bb other than hard light emitter Sb is set as holding position Pb to be sucked by suction nozzle 8*b*. In this example, a position moved by holding position correction value F(Xf, Yf) from light emission center Csb (position of the functional unit) of light emitter Sa is selected as holding position Pb. In light emitting element Db, holding position Pb is set at a position not overlapping with light emitter Sb (functional unit).

Hereinafter, when it is not necessary to distinguish light emitting element Da and light emitting element Db, light emitting element Da and light emitting element Db are simply referred to as "light emitting element D", and light emitter Sa and light emitter Sb are referred to as "light emitter S". In addition, main body Ba and main body Bb are referred to as "main body B", and electrodes E1*a* and E2*a* and electrodes E1*b* and E2*b* are referred to as "electrodes E1 and E2". In addition, upper surface Dua and upper surface Dub are referred to as "upper surface Du", and back surface Dda and back surface Ddb are referred to as "back surface Dd". In addition, light emission center Csa and light emission center Csb are referred to as "light emission center Cs", and holding position Pa and holding position Pb are referred to as "holding position P". Hereinafter, light emitting element D is described as an example of the electronic component which is supplied by tape feeder 5 and mounted on substrate 3 by the component mounting operation by component mounting mechanism 9.

Figure 5A:
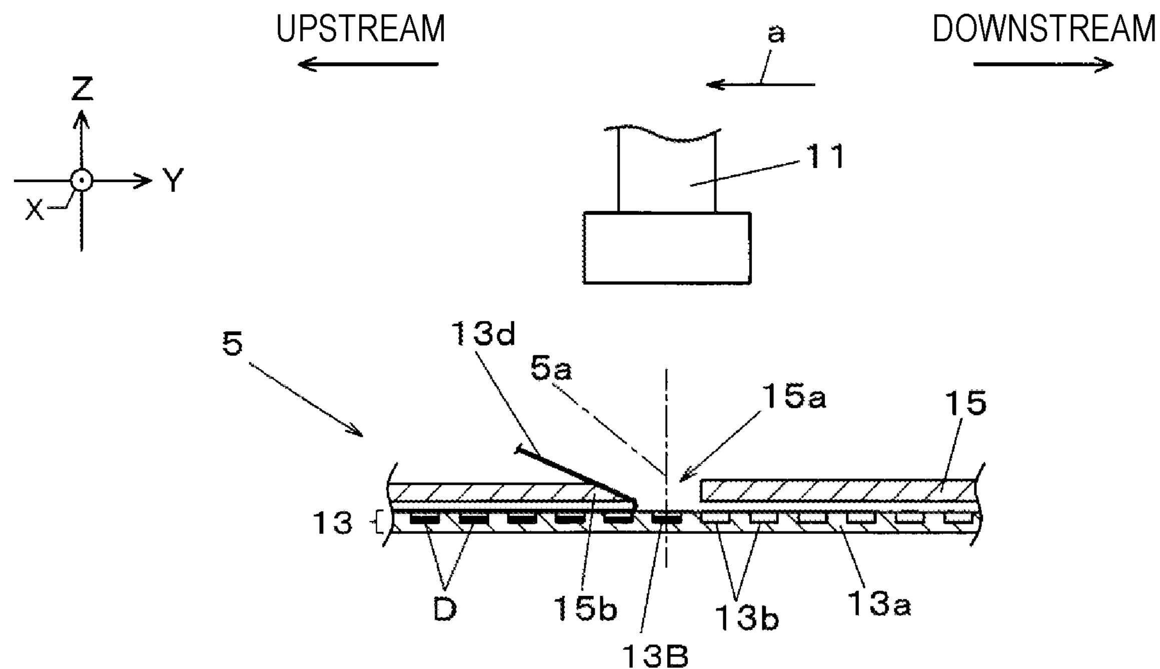
FIG. 5A is a diagram illustrating a state in which a pocket that is pitch fed to a component supply position of a tape feeder included in the component mounting device according to the exemplary embodiment of the present disclosure is photographed by a substrate recognition camera.

Next, recognition operation by second recognition camera 11 regarding the recognition operation of light emitting element D supplied to component supply position 5*a* is described with reference to FIGS. 5A and 5B. In FIG. 5A, pressing member 15 that guides carrier tape 13 from above is disposed on tape feeder 5. Pressing member 15 is provided with opening 15*a* at component supply position 5*a*.

Figure 5B:
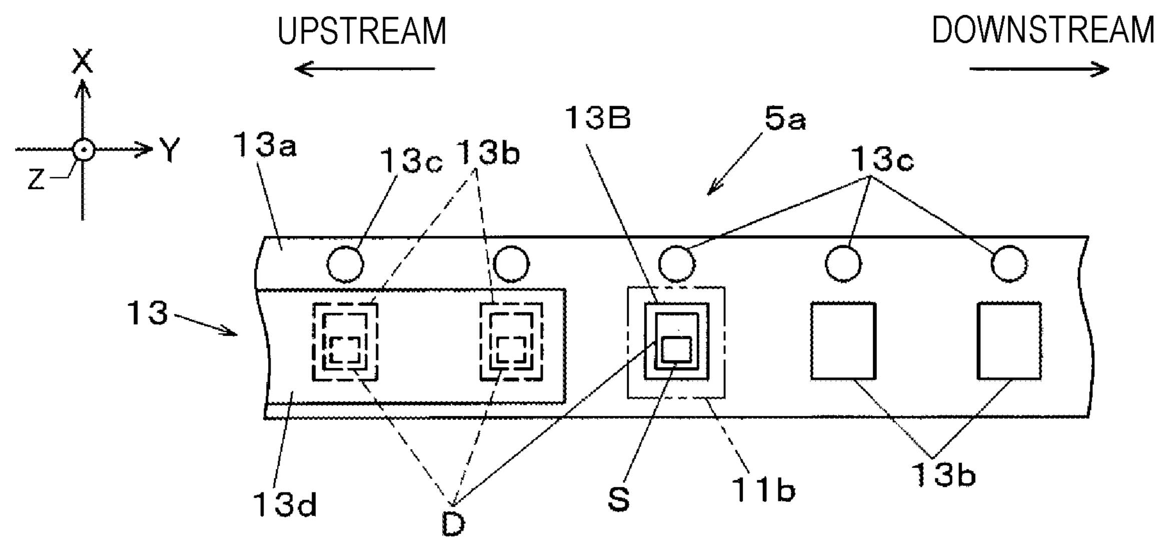
FIG. 5B is a top view of a part of a carrier tape that is pitch fed by the tape feeder included in the component mounting device according to the exemplary embodiment of the present disclosure.

FIG. 5B illustrates carrier tape 13 in the vicinity of component supply position 5*a* as viewed from above, and pressing member 15 is not illustrated. On base tape 13*a* of carrier tape 13, recessed pockets 13*b* for storing light emitting elements D, and feed holes 13*c* with which sprockets (not illustrated) for pitch feeding carrier tape 13 engage are provided at equal intervals. Cover tape 13*d* is pasted to the upper surface of pockets 13*b* storing light emitting elements D.

In FIG. 5A, cover tape 13*d* is peeled off and folded back at edge 15*b* of opening 15*a*. As a result, component supply position 5*a* and the upper side of pocket 13*b* located downstream (right in FIG. 5A) of component supply position 5*a* are opened. Hereinafter, pocket 13*b* pitch fed to component supply position 5*a* is referred to as target pocket 13B. As indicated by arrow a, by Y-axis beam 6 and X-axis beam 7 being driven, second recognition camera 11 moves above component supply position 5*a* and photographs target pocket 13B at component supply position 5*a* through opening 15*a*.

Figure 6A:
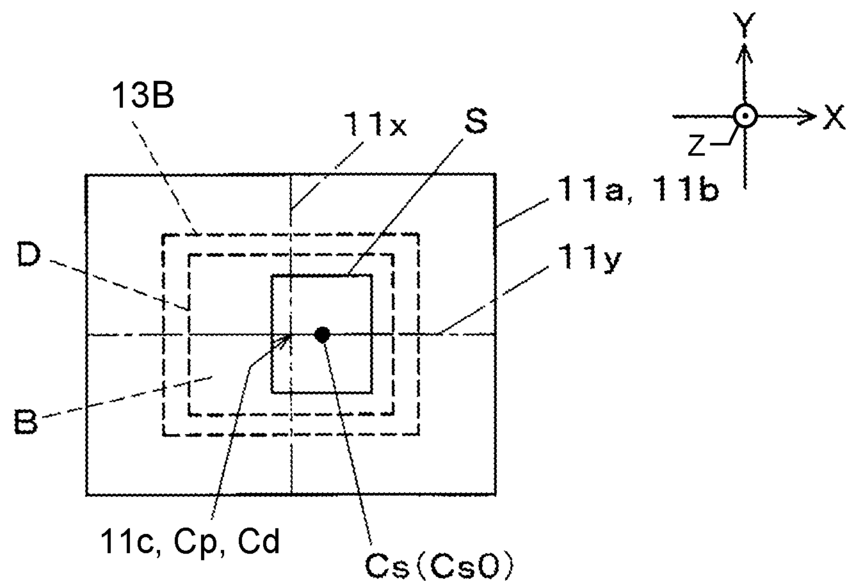
FIG. 6A is a diagram illustrating an example in which the center of a light emitter of the light emitting element supplied by the tape feeder included in the component mounting device according to the exemplary embodiment of the present disclosure does not deviate from a target position.

Next, an example of recognition image 11*a* of target pocket 13B photographed by second recognition camera 11 is described with reference to FIGS. 6A and 6B. Second recognition camera 11 photographs target pocket 13B so that light emitter S of light emitting element D can be selectively recognized. FIG. 6A illustrates an example in which there is no relative positional deviation among target pocket 13B, light emitting element D, light emitter S, and second recognition camera 11. In recognition image 11*a*, target pocket 13B and main body B of light emitting element D are not recognized, but for convenience, the position of target pocket 13B and the position of main body B of light emitting element D are indicated by dotted lines in the drawing.

In FIG. 6A, pocket center Cp indicates the center of target pocket 13B indicated by the dotted line, and component center Cd indicates the center of light emitting element D indicated by the dotted line. When second recognition camera 11 moves above component supply position 5*a* as illustrated in FIG. 5A, center 11*c* of photographing field 11*b* of second recognition camera 11 illustrated in FIG. 6A coincides with pocket center Cp and component center Cd. In recognition image 11*a*, center line 11*x* orthogonal to the X axis and center line 11*y* orthogonal to the Y axis are displayed in an overlapping manner. In addition, light emission center Cs of light emitter S recognized based on recognition image 11*a* is displayed with a black circle. Light emission center Cs when there is no relative positional deviation as described above is defined as target light emission center Cs0 of light emitter S.

Figure 6B:
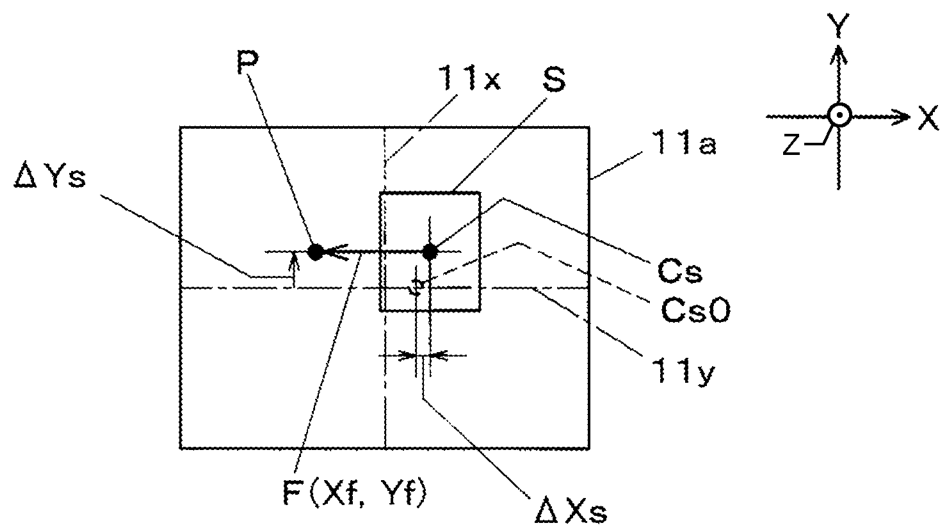
FIG. 6B is a diagram illustrating an example in which the center of the light emitter of the light emitting element supplied by the tape feeder included in the component mounting device according to the exemplary embodiment of the present disclosure deviates from the target position.

FIG. 6B illustrates an example of recognition image 11*a* in which light emission center Cs of light emitter S deviates from target light emission center Cs0. Light emitting element D moving in target pocket 13B causes light emission center Cs to deviate from target light emission center Cs0. As is described later, first processor 31 illustrated in FIG. 7 performs recognition processing on recognition image 11*a*. As a result, first processor 31 calculates light emitter positional deviation amounts ΔXs and ΔYs indicating amounts of positional deviation of light emission center Cs of light emitter S from target light emission center Cs0 along the X axis and the Y axis. As described above, first processor 31 and second recognition camera 11 movable together with component mounting mechanism 9 function as a recognition unit that recognizes the position of light emitter S. That is, the recognition unit recognizes the position of the functional unit of the electronic component supplied by tape feeder 5 which is the component supply mechanism. The position of the functional unit is a position in the visual field range (photographing field 11*b*) of the recognition unit.

In FIG. 6B, holding position P when light emitting element D is sucked by suction nozzle 8*b* is determined to be a position moved by holding position correction value F(Xf, Yf) from light emission center Cs of recognized light emitter S. That is, holding position P is determined to be a position obtained by adding holding position correction value F(Xf, Yf) to light emitter positional deviation amounts ΔXs and ΔYs calculated from recognition image 11*a*.

Holding position P illustrated in FIG. 6B is an example applied to light emitting element Db described with reference to FIGS. 4A to 4C and set at the position not overlapping light emitter S. On the other hand, in the case of light emitting element Da in which holding position P is set at the position of light emitter S described with reference to FIGS. 3A to 3C, light emission center Cs of recognized light emitter S is determined as holding position P.

Figure 7:
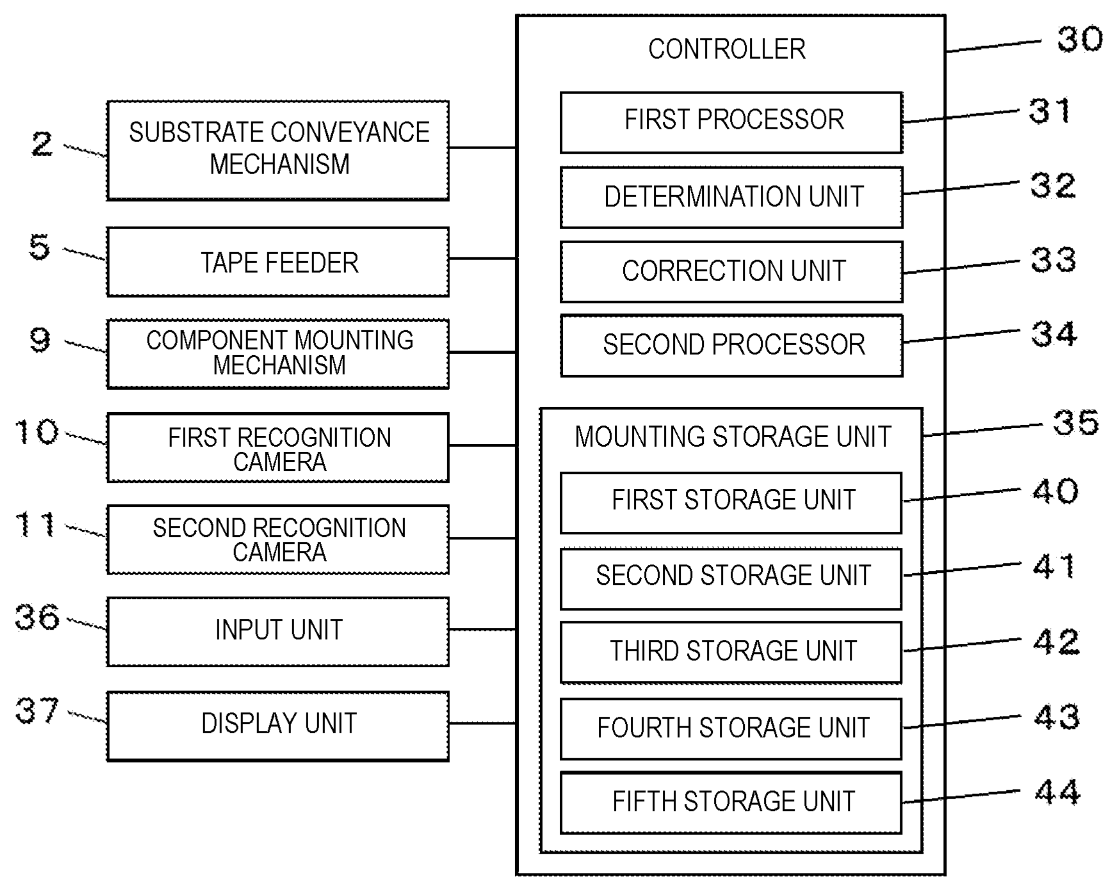
FIG. 7 is a functional block diagram showing a configuration of a control system of the component mounting device according to the exemplary embodiment of the present disclosure.

Next, a configuration of a control system of component mounting device 1 is described with reference to FIG. 7. Component mounting device 1 includes controller 30, substrate conveyance mechanism 2, tape feeder 5, component mounting mechanism 9, first recognition camera 10, second recognition camera 11, input unit 36, and display unit 37. Controller 30 includes first processor 31, holding position determination unit (hereinafter, referred to as determination unit) 32, mounting position correction unit (hereinafter, referred to as correction unit) 33, second processor 34, and mounting storage unit 35. Mounting storage unit 35 is a storage device, and includes first storage unit 40, second storage unit 41, third storage unit 42, fourth storage unit 43, and fifth storage unit 44. Input unit 36 is an input device such as a keyboard, a touch panel, or a mouse, and is used when an operation command or data is input. Display unit 37 is a display device such as a liquid crystal panel, and displays, for example, recognition image 11*a* as well as various types of data.

First storage unit 40 stores data (mounting data) such as a mounting position of light emitting element D mounted on substrate 3 for each type of substrate 3 to be produced. Second storage unit 41 stores data (component data) such as the size of light emitting element D mounted on substrate 3, the size of light emitter S and the position thereof in light emitting element D, and holding position correction value F(Xf, Yf) for each type of light emitting element D. As described above, first processor 31 performs the recognition processing on recognition image 11*a* photographed by second recognition camera 11, and calculates light emitter positional deviation amounts ΔXs and ΔYs, which are the positional deviation amounts of light emission center Cs of light emitter S. Third storage unit 42 stores calculated light emitter positional deviation amounts ΔXs and ΔYs as recognition results.

Determination unit 32 determines holding position P when suction nozzle 8*b* sucks light emitting element D based on holding position correction value F(Xf, Yf) stored in second storage unit 41 and light emitter positional deviation amounts ΔXs and ΔYs stored in third storage unit 42. In this manner, determination unit 32 determines holding position P of light emitting element D by component mounting mechanism 9 based on the position of light emitter S recognized by second recognition camera 11 and first processor 31. That is, determination unit 32 determines holding position P of the electronic component by component mounting mechanism 9 based on the position of the functional unit recognized by the recognition unit. Fourth storage unit 43 stores determined holding position P.

Correction unit 33 corrects the mounting position based on the position of light emitter S so that light emitter S is disposed at a predetermined position on substrate 3. The position of light emitter S is based on the mounting position of light emitting element D stored in first storage unit 40, the position of light emitter S in light emitting element D stored in second storage unit 41, light emitter positional deviation amounts ΔXs and ΔYs of light emitter S stored in third storage unit 42, and the like. Fifth storage unit 44 stores the corrected mounting position as a mounting correction value.

Second processor 34 controls component mounting mechanism 9 based on holding position P stored in fourth storage unit 43 to suck light emitting element D by suction nozzle 8*b*. Further, second processor 34 controls component mounting mechanism 9 based on the corrected mounting position stored in fifth storage unit 44 to mount light emitting element D on substrate 3 so that light emitter S is disposed at a predetermined position on substrate 3.

Note that first storage unit 40 and second storage unit 41 constituting mounting storage unit 35 are constituted of a random access memory (RAM), a read-only memory (ROM), and the like. Third storage unit 42 to fifth storage unit 44 are constituted of a rewritable RAM, a flash memory, a hard disk, and the like. Two or more of the above units may be integrally configured. First processor 31, determination unit 32, correction unit 33, and second processor 34 are constituted of a central processing unit (CPU) or a large-scale integrated circuit (LSI). Alternatively, the above units may be constituted of a dedicated circuit, and may be achieved by general-purpose hardware being controlled by software read from a transient or non-transient storage device. Two or more of the above units may be integrally configured.

Figure 8:
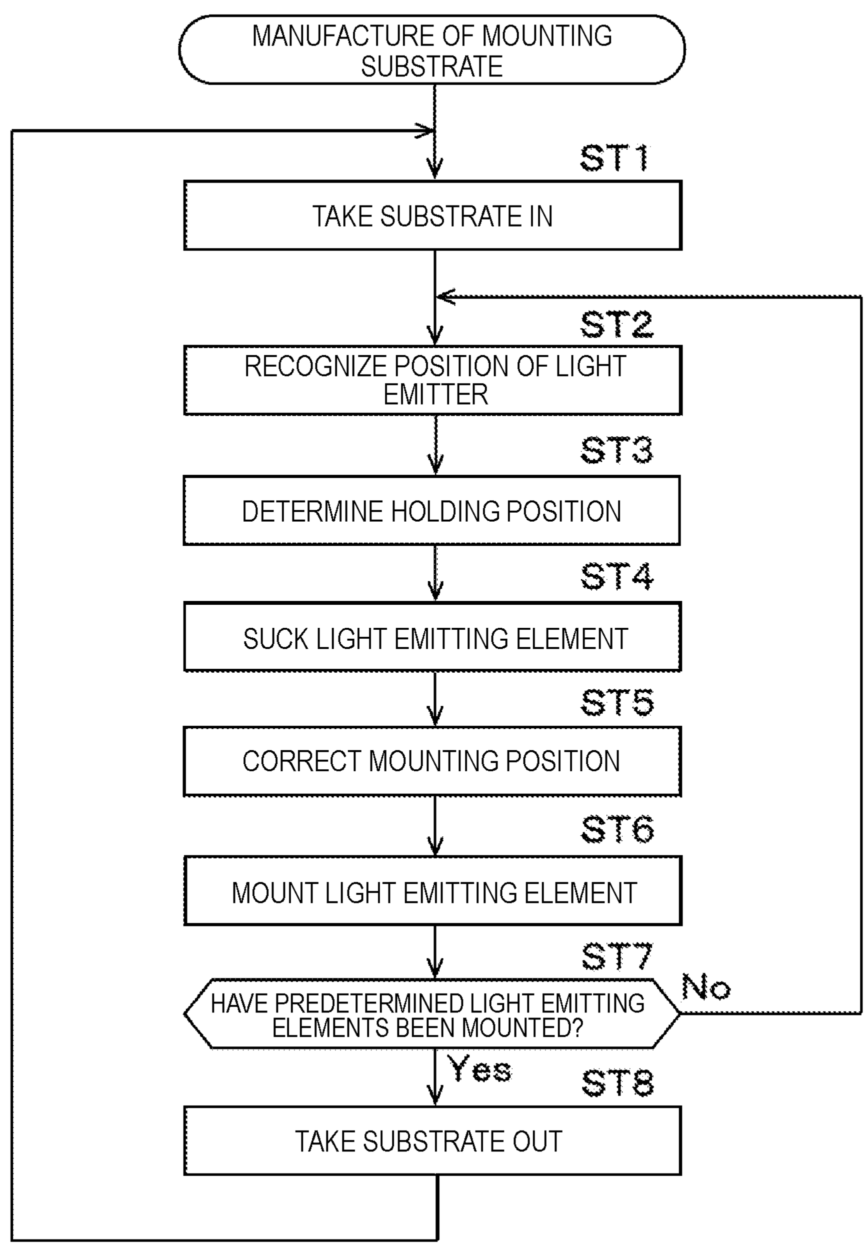
FIG. 8 is a flowchart illustrating a manufacturing method for a mounting substrate by the component mounting device according to the exemplary embodiment of the present disclosure.

Next, a manufacturing method for a mounting substrate using component mounting device 1 is described with reference to FIG. 8. First, substrate 3 is taken into component mounting device 1 by substrate conveyance mechanism 2 and is positioned and held at the mounting operation position (ST1). Next, second recognition camera 11 and first processor 31 recognize the position of light emitter S provided on upper surface Du of light emitting element D (ST2). In ST2, light emitting element D is supplied to component supply position 5*a* of tape feeder 5. That is, the recognition unit recognizes the functional unit of the electronic component on the component supply mechanism that supplies the electronic component.

Next, determination unit 32 determines holding position P of light emitting element D by component mounting mechanism 9 based on the recognized position of light emitter S (ST3). In the case of light emitting element Da illustrated in FIG. 3, holding position P is determined to be a position of light emitter S, and in the case of light emitting element Db illustrated in FIG. 4, holding position P is determined to be a position not overlapping light emitter S. Then, second processor 34 controls component mounting mechanism 9 to hold light emitting element D at holding position P by suction nozzle 8*b* (ST4).

Correction unit 33 corrects the mounting position based on the recognized position of light emitter S so that light emitter S is disposed at a predetermined position on substrate 3 (ST5). That is, component mounting mechanism 9 holds light emitting element D at holding position P and mounts light emitting element D on substrate 3. Then, second processor 34 controls component mounting mechanism 9 to mount light emitting element D at the corrected mounting position (ST6). Thus, light emitting element D is mounted on substrate 3 so that light emitter S is disposed at a predetermined position on substrate 3.

Next, if not all light emitting elements D are mounted on substrate 3 (No in ST7), the process returns to ST2 to recognize light emitter S of next light emitting element D, and holding position P and the mounting position are corrected before next light emitting element D is mounted on substrate 3. If all predetermined light emitting elements D are mounted on substrate 3 (Yes in ST7), controller 30 controls substrate conveyance mechanism 2 to take substrate 3 out to the downstream (ST8), and returns to ST1 to take in substrate 3 to be mounted next.

As described above, component mounting device 1 includes tape feeder 5, second recognition camera 11 and first processor 31, component mounting mechanism 9, and determination unit 32, and mounts light emitting element D including light emitter S on substrate 3. Tape feeder 5 is a component supply mechanism that supplies light emitting element D which is the electronic component. Second recognition camera 11 and first processor 31 function as the recognition unit that recognizes the position (light emission center Cs) of the functional unit. Component mounting mechanism 9 holds the electronic component supplied from the component supply mechanism and mounts the electronic component on substrate 3. Determination unit 32 determines holding position P of the electronic component by component mounting mechanism 9 based on the position of the functional unit recognized by the recognition unit. As a result, the electronic component having the functional unit can be sucked at an appropriate position and can be mounted on substrate 3.

Note that second recognition camera 11 and first processor 31 function as the recognition unit that recognizes the position of the functional unit in the electronic component, and second recognition camera 11 is movable together with component mounting mechanism 9. In addition, the recognition unit recognizes the position of the functional unit of the electronic component supplied by tape feeder 5. First processor 31 may be built in second recognition camera 11. That is, at least a part of the recognition unit is movable together with component mounting mechanism 9.

Although light emitting element D having light emitter S has been described above as an example of the electronic component having the functional unit, the electronic component is not limited to light emitting element D. For example, the electronic component may be an image sensor having a sensor region for image capturing on the upper surface as a functional unit. Alternatively, the electric component may be a processor having a processor chip as a functional unit and having a heat sink for the processor chip on the upper surface. In this case, because the heat sink is located on the processor chip, the holding position is determined to be a position not overlapping the processor chip.

INDUSTRIAL APPLICABILITY

By the component mounting device and the manufacturing method for the mounting substrate of the present disclosure, the electronic component having the functional unit can be sucked at an appropriate position and can be mounted on the substrate. Therefore, the component mounting device and the manufacturing method are useful in the field of mounting electronic components on a substrate.

REFERENCE MARKS IN THE DRAWINGS

1 component mounting device
1*a* base
2 substrate conveyance mechanism
3 substrate
4 component supply unit
5 tape feeder (component supply mechanism)
5*a* component supply position
6 Y-axis beam
7 X-axis beam
7*a* plate
8 mounting head
8*a* suction unit
8*b* suction nozzle
9 component mounting mechanism
10 component recognition camera (first recognition camera)
11 substrate recognition camera (second recognition camera)
11*a* recognition image
11*b* photographing field
11*c* center
11*x*, 11*y* center line
12 carriage
12*a* feeder base
13 carrier tape
13*a* base tape
13*b* pocket
13B target pocket
13*c* feed hole
13*d* cover tape
14 tape reel
15 pressing member
15*a* opening
15*b* edge
30 controller
31 first processor
32 holding position determination unit (determination unit)
33 mounting position correction unit (correction unit)
34 second processor
35 mounting storage unit
36 input unit
37 display unit
40 first storage unit
41 second storage unit
42 third storage unit
43 fourth storage unit
44 fifth storage unit
B, Ba, Bb main body
Cs, Csa, Csb light emission center
D, Da, Db Light emitting element
Du, Dua, Dub upper surface
Dd, Dda, Ddb back surface
E1, E2, E1*a*, E2*a*, E1*b*, E2*b* electrode
P, Pa, Pb holding position
S, Sa, Sb light emitter

The invention claimed is:

1. A component mounting device configured to mount, on a substrate, a light emitting element having a light emitter, the component mounting device comprising:

a storage unit that stores data including a holding position correction value set for each type of light emitting elements;

a component supply mechanism that supplies the light emitting element;

a recognition unit that recognizes a position of the light emitter;

a component mounting mechanism that holds the light emitting element supplied from the component supply mechanism and mounts the light emitting element on the substrate; and a holding position determination unit that calculates, utilizing the recognized position of the light emitter and the holding position correction value, a position to be held by the component mounting mechanism, wherein the holding position correction value is set for each type of light emitting elements and determines the calculated position as a holding position of the light emitting element.

2. The component mounting device according to claim 1, wherein the holding position determination unit determines a position not overlapping the light emitter in the light emitting element as the holding position.

3. The component mounting device according to claim 2, wherein the position not overlapping the light emitter is off from a center of the light emitting element.

4. The component mounting device according to claim 1, wherein the holding position determination unit determines the position of the light emitter as the holding position.

5. The component mounting device according to claim 1, wherein the recognition unit is movable together with the component mounting mechanism in at least a part of the recognition unit, and the recognition unit recognizes the position of the light emitter on the component supply mechanism.

6. The component mounting device according to claim 1, wherein the component mounting device further comprises a mounting position correction unit that corrects a mounting position of the light emitting element on the substrate based on the position of the light emitter to cause the light emitter to be positioned at a predetermined position on the substrate.

7. The component mounting device according to claim 1, wherein the position to be held by the component mounting mechanism is a position to be shifted by the holding position correction value from a center of the light emitter.

8. A manufacturing method for a mounting substrate, the mounting substrate being manufactured using a component mounting device configured to hold a light emitting element having a light emitter and mount the light emitting element on a substrate by a component mounting mechanism, the manufacturing method comprising:

recognizing a position of the light emitter;

calculating, utilizing the recognized position of the light emitter and a holding position correction value, a position to be held by the component mounting mechanism, wherein the holding position correction value is set for each type of light emitting elements; and holding the light emitting element at the holding position and mounting the light emitting element on the substrate by the component mounting mechanism.

9. The manufacturing method for the mounting substrate according to claim 6, wherein the holding position is determined to be a position not overlapping the light emitter in the light emitting element.

10. The manufacturing method for the mounting substrate according to claim 9, wherein the position not overlapping the light emitter is off from a center of the light emitting element.

11. The manufacturing method for the mounting substrate according to claim 6, wherein the holding position is determined to be the position of the light emitter.

12. The manufacturing method for the mounting substrate according to claim 6, wherein the position of the light emitter is recognized on a component supply mechanism that supplies the light emitting element.

13. The manufacturing method for the mounting substrate according to claim 8, wherein the manufacturing method further comprising correcting a mounting position of the light emitting element on the substrate based on the position of the light emitter to cause the light emitter to be positioned at a predetermined position on the substrate.

14. The manufacturing method for the mounting substrate according to claim 8, wherein the position to be held by the component mounting mechanism is a position to be shifted by the holding position correction value from a center of the light emitter.

* * * * *